United States Patent [19]

Swan

[11] 3,751,247

[45] Aug. 7, 1973

[54] PHOTOCONDUCTIVE COMPOSITIONS CONTAINING FERROCENE-CONTAINING ALDEHYDE POLYMERS

[75] Inventor: David W. Swan, Harlow, England

[73] Assignee: Minnesota Mining and Manufacturing Company, St. Paul, Minn.

[22] Filed: Apr. 8, 1971

[21] Appl. No.: 132,592

[30] Foreign Application Priority Data

Apr. 8, 1970 Great Britain ........................ 16758

[52] U.S. Cl. ........................ 96/1.5, 96/92, 252/501, 260/439 CY

[51] Int. Cl. ................................................ G03g 5/06

[58] Field of Search ................ 96/1.5, 92; 252/501; 250/439 CY

[56] References Cited

UNITED STATES PATENTS

| | | | |
|---|---|---|---|
| 3,335,008 | 8/1967 | Dubosc | 260/439 CY X |
| 3,490,907 | 1/1970 | Schenck et al. | 260/439 CY X |
| 3,352,888 | 11/1967 | Matsumago | 260/439 CY X |
| 3,577,235 | 4/1971 | Contais | 96/1.5 X |

*Primary Examiner*—Norman G. Torchin
*Assistant Examiner*—John R. Miller, Jr.
*Attorney*—Alexander, Sell, Steldt & Delahunt

[57] ABSTRACT

This invention relates to photoconductive compositions which become permanently conductive when exposed to actinic radiation. The compositions comprise a ferrocene-containing polymer in intimate association with another compound, which is preferably one containing halogen atoms, the composition forming a conductive reaction product when exposed to actinic radiation. These compositions are useful in the preparation of photoconductive layers which can be used in image reproduction processes particularly to copy finely-detailed originals giving continuous tone copies.

14 Claims, No Drawings

PHOTOCONDUCTIVE COMPOSITIONS CONTAINING FERROCENE-CONTAINING ALDEHYDE POLYMERS

This invention relates to photoconductive compositions. More particularly the invention relates to photoconductive compositions which become permanently conducting when exposed to light or other actinic radiation and to the use of such compositions in the formation of visible image reproduction.

BACKGROUND OF THE INVENTION

The application of photoconducting materials to the formation and development of images by electrostatic means is well known and numerous photoconducting systems have been developed for use in such processes. Some of these systems exhibit photoconductivity which persists for several hours whilst most systems return rapidly to an insulating state once they cease to be exposed to the light. Consequently, in order to make multiple copies from an original, re-exposure of the photoconductor becomes necessary.

It is an object of the invention to provide a photoconductive composition which becomes permanently conductive upon exposure to light.

BRIEF DESCRIPTION OF THE INVENTION

According to the invention there is provided a photoconductive composition which comprises a ferrocene-containing polymer intimately associated with at least one other compound and which undergoes reaction upon light or other actinic radiation exposure to form a conductive product.

Such compositions become permanently conductive after exposure to light or other actinic radiation because a conductive product is formed by the exposure. The compositions of the invention are, therefore, unlike photoconductors in which conduction is due to the lifting of electrons to the conduction band which does not continue in the absence of light. The photoconductive compositions according to the invention can, therefore, be used to the preparation of multiple copies from an original without re-exposure.

The said other compound is preferably an organic compound which contains halogen atoms, although inorganic compounds containing halogen atoms can be used and in one embodiment of the invention the said other compound is a compound capable of providing halogen free-radicals when the composition is exposed to light or other actinic radiation.

It appears that when the compositions of the invention are exposed to light or other actinic radiation, energy is believed to be absorbed by the ferrocene-containing polymer and this absorbed energy is used in the reaction in which the conductive product is formed. Possibly, and although we are not certain about this, the reaction which occurs is probably the transfer by means of a halogen free-radical mechanism of halogen atoms from the organic compound to the ferrocene-containing polymer.

Examples of suitable organic compounds containing halogen atoms include carbon tetrabromide, iodoform, hexabromoethane, tribromoquinaldine, and 2-methyl-4,6-bis(trichloromethyl) triazine.

The polymeric nature of the ferrocene-containing polymer means that the photoconductive compositions of the invention can be prepared as a thin coating on a suitable substrate without the need for a separate binder. However, in some instances and particularly where relatively thick coatings are required the composition can additionally contain a separate binder.

Because the ferrocene is bound in a polymeric form there is no tendency for it to sublime from the photoconductive compositions.

The photoconductive compositions of the invention contain the ferrocene-containing polymer and the said other compound in intimate association, e.g. reactive association. These compositions can therefor form coatings having a high optical resolution because the composition is not in particulate form and is not limited by the sizes of such particles. Such coatings are, therefore, useful in the copying of finely-detailed originals.

We find that the degree of conductivity which results upon exposure to light is at least approximately proportional to the amount of light. This has the advantage that continuous tone copies can be prepared using coatings of compositions of the invention.

There are many suitable ferrocene-containing polymers. They can, for example, be produced by the condensation of ferrocene with an aldehyde. Thus, aliphatic aldehydes such as formaldehyde or its precursor paraformaldehyde, or aromatic or substituted aromatic aldehydes such as benzaldehyde or salicyladehyde can be used. Another suitable polymer is poly-(vinylferrocene).

Preferably the photoconductive compositions according to the invention contain from 0.01 to 3 moles of the said other compound per mole of the ferrocene-containing polymer.

The compositions of the invention can be supported on any suitable backing sheet such as, for example, paper, a plastics film, e.g. a polyester film, glass or a metal sheet. Where the backing sheet is not conductive it is often desirable to provide a conductive film between the layer of the composition of the invention and the backing sheet.

The photoconductive compositions can be spread on the backing sheet in any convenient manner. A thin coating is normally satisfactory, e.g. of a thickness of from 1 to 150 microns, and this can readily be achieved by spreading a solution of the composition onto the backing sheet and then evaporating off the solvent, so leaving a thin uniform coating of the composition.

Coatings of compositions of the invention can be used in a number of ways. If the coating is electrostatically charged and then exposed to a light image, the charge will leak away in the light-struck areas so leaving an electrostatic image on the coating. This image can then be developed by dusting with a fine powder which can then be either fixed in place or transferred to a copy sheet and the coating re-charged and re-developed as many times as required. Alternatively, the coatings of the invention can be exposed to light so as to give a conductivity image which can then be developed image-wise by electrodeposition on the surface of the coating.

PRESENTLY PREFERRED EMBODIMENTS OF THE INVENTION

The invention will now be illustrated by the following Examples. In these the conductivity of coatings of compositions according to the invention were measured in one of two ways.

The first involved the deposition of the photoconductive composition onto the aluminium side of an aluminised polyester film. This aluminium layer served as one electrode and a mercury pool was placed on the surface of the compositions and was used as the second electrode. The advantages of using a mercury pool as one electrode were that it could easily be moved from one area of the surface to another and that it could be removed temporarily when required to expose the composition to light between measurements.

The second involved the deposition of the photoconductive composition onto an insulating substrate and measuring the conductivity between two electrodes on the surface of the coating.

In both methods conductivity and capacitance were measured at 1592 hz using a Wayne Kerr impedence bridge, while d.c. conductivity was measured using an electrometer and a suitable power supply. In both methods, qualititatively similar conductivity results were found.

EXAMPLE 1

A polymer was formed by a condensation reaction between ferrocene and formaldehyde, as described in C. R. Acad. Sci. Paris, 258, 5870 (1964). This polymer was soluble in toluene, benzene and dichloromethane.

A solution of 1 part of this ferrocene-containing polymer and 0.5 part of carbon tetrabromide in 3 parts of toluene was coated onto the aluminium side of an aluminised polyester film. After drying the coating was clear, smooth and flexible.

This photosensitive coating was then exposed to 1580 candelas at 500 cm for 60 seconds using a neutral step wedge. After exposure the conductivity was measured using a mercury pool electrode and the Wayne Kerr impedence bridge. It was observed that an exposure of about $10^5$ mcs was necessary to double the dark conductivity.

EXAMPLE 2

A photosensitive material was formed on aluminised polyester as described in Example 1, which was then exposed for various times through a neutral step edge to a quartz-iodine light source. Measurement of conductivity with the Wayne Kerr bridge showed that, over about three orders of magnitude change in exposure, the change in conductivity was proportional to exposure.

EXAMPLE 3

A photosensitive material as described in Example 1 was solvent cast onto an insulating polyester substrate, and two electrodes 1.8 cm long were painted onto the surface 0.9 cm apart. So as to measure the conductivity between the electrodes, the photosensitive polymer around the electrodes was removed except for that directly between the electrodes. A d.c. voltage of 1000v was applied between the electrodes, and the current was measured for various light exposures. As in Example 2, the change in conductivity was proportional to exposure over several orders of magnitude change in exposure.

EXAMPLES 4 to 6

A series of three photoconducting coatings was made as in Example 1, except that varying amounts of carbon tetrabromide were used. The amounts of carbon tetrabromide added per one part of ferrocene-containing polymer were 0.1, 0.5 and 2 parts by weight.

All coatings were exposed to a quartz-iodine light source through a neutral step wedge, and conductivity was measured with the Wayne Kerr impedence bridge. The dark conductivity was increased slightly with the high carbon tetrabromide concentration. A ten-fold increase in exposure was required with the 0.1 part carbon tetrabromide when compared with the 0.5 part carbon tetrabromide in in order to give a comparable conductivity change. At a given exposure the efficiency of the process (increase in conductivity per unit weight of carbon tetrabromide) was maximum at a carbon tetrabromide concentration of about 0.5 to 1 part per part of ferrocene-containing polymer. At higher concentrations of carbon tetrabromide the efficiency decreased.

EXAMPLE 7

A photosensitive coating solution was made using 2 parts by weight of carbon tetrabromide, 1 part by weight of the ferrocene-containing polymer as used in Example 1 in 2.7 parts by weight of toluene, and 0.5 part by weight of a styrene-butadiene copolymer as a binder. After coating and drying, this photosensitive film was exposed to a quartz-iodine light source through a neutral step wedge and the conductivity was measured over a range of exposures using the Wayne Kerr bridge. The variation in conductivity with exposure was not very different from that measured on a similar composition but without the binder.

EXAMPLE 8

A photosensitive member was formed by coating a solution of 1 part by weight of the ferrocene-containing polymer as used in Example 1 and 0.5 part by weight of carbon tetrabromide in 2.7 part by weight of toluene onto a polyester substrate. After exposing to an image, the surface was charged by a corona discharge. The unexposed areas remained insulating and held their charge, while the exposed areas allowed the charge to leak away. The electrostatic image was developed using finely dispersed carmine in n-hexane as the toner to give an excellent finely detailed image.

EXAMPLE 9

A solution of 1 part of the ferrocene-containing polymer described in Example 1 in 2.7 parts of toluene was shaken with excess hexabromoethane for ten minutes, after which excess solid was filtered off. The solution was coated onto a glass substrate and the solvent removed. Two electrodes 2.5 cm long were painted onto the surface of the photosensitive polymer with a gap of 0.5 cm between them. A d.c. voltage of 1000V was applied between the electrodes and the current measured for various light exposures. The increase in conducitivity with exposure was found to be proportional to $(\text{exposure})^{1.0}$ for a wide range of exposures.

EXAMPLE 10

A photosensitive coating was solvent cast onto a glass substrate from a solution consisting of 1 part of the ferrocene-containing polymer described in Example 1 and 0.38 parts of tribromoquinaldine in 2.7 parts of toluene. The conductivity of this coating was determined by measuring the current flowing between two parallel electrodes 2.5 cm long and 0.5 cm apart on the surface of the polymer with a potential of 1000V applied. The conductivity variation with exposure was observed to be proportional to $(\text{exposure})^{0.82}$ over several orders of magnitude change in exposure.

EXAMPLE 11

A solution of 1 part of the ferrocene-containing polymer described in Example 1 and 0.35 parts of iodoform in 2.7 parts of toluene was coated onto a glass substrate and dried. The change in conductivity of the coating with change in light exposure was measured by observing the current flowing between two electrodes on the surface of the polymer. These electrodes were 2.5 cm long and 0.5 cm apart and a potential of 1000V was applied between them. The increase in conductivity with increasing exposure was found to be proportional to $(\text{exposure})^{0.82}$.

EXAMPLE 12

A mixture of 1 part of ferrocene-containing polymer as described in Example 1 and 0.31 parts of 2-methyl-4,6-bis(trichloromethyl)triazine in 2.7 parts of toluene was coated onto a glass substrate and dried. Electrodes of length 2.5 cm were painted on the surface with a gap of 0.5 cm between them. A voltage of 1000V was applied, and the current measured for various light exposures. It was found that the conductivity increased in proportion to $(\text{exposure})^{1.38}$ for a wide range of exposures.

EXAMPLE 13

A polymer was formed by a condensation reaction between ferrocene and benzaldehyde, following the procedure described in C.R. Acad. Sci. Paris, 258, 5870 (1964) except that the paraformaldehyde was replaced with benzaldehyde.

A solution of 1 part of this ferrocene-containing polymer and 0.23 parts of carbon tetrabromide in 1.8 parts of toluene was coated onto a glass substrate. After drying, electrodes were painted onto the surface 2.5 cm long with a gap of 0.5 cm. The current was measured for various light exposures for an applied potential of 1000V. It was observed that the conductivity increased with exposure in proportion to $(\text{exposure})^{1.38}$ over several orders of magnitude change in exposure.

EXAMPLE 14

A polymer was formed by the condensation of salicylaldehyde with ferrocene, following the procedure described in C.R. Acad. Sci. Paris 258, 5870 (1964) except that the paraformaldehyde was replaced with salicylaldehyde.

A photosensitive coating was deposited on a glass substrate by solvent casting from a solution of 1 part ferrocene-salicylaldehyde polymer and 0.21 parts of carbon tetrabromide in 1.8 parts of toluene. The conductivity of this film was measured by observing the current flowing between two parallel electrodes 0.5 cm apart and 2.5 cm in length with 1000V applied between them.

The permanent conductivity was found to increase with light exposure in proportion to $(\text{exposure})^{0.95}$.

As can be seen from these Examples, the photoconductive compositions according to the invention become permanently conductive upon exposure to light and the resulting conductivity varies with the amount of incident light.

I claim:

1. In a photoconductive composition system which contains ferrocene compound mixed with at least one organic compound which contains halogen atoms and which is capable of providing halogen free-radicals when the composition is exposed to actinic radiation the improvement which comprises providing said ferrocene compound as a ferrocene-containing aldehyde polymer.

2. A composition according to claim 1 which additionally contains a binder.

3. A composition according to claim 1 in which said ferrocene-containing polymer has been prepared by condensation of ferrocene with an aldehyde.

4. A composition according to claim 3 in which said ferrocene-containing polymer has been prepared by condensation of ferrocene with an aldehyde chosen from the group consisting of formaldehyde and the formaldehyde precursor paraformaldehyde.

5. A composition according to claim 3 in which said ferrocene-containing polymer has been prepared by condensation of ferrocene with an aldehyde chosen from the group consisting of benzaldehyde and salicylaldehyde.

6. A composition according to claim 1 in which said compound containing halogen atoms is chosen from the group consisting of carbon tetrabromide, iodoform, hexabromoethane and tribromoquinaldine.

7. A composition according to claim 1 in which said compound containing halogen atoms is 2-methyl-4,6-bis(trichloromethyl) triazine.

8. A composition according to claim 1 which contains from 0.01 to 3 moles of said organic compound containing halogen atom per mole of said ferrocene containing polymer.

9. A composition according to claim 1 which contains from 0.01 to 3 moles of said other compound per mole of said ferrocene-containing polymer.

10. A photoconductive material comprising:

a. a layer of a photoconductive composition according to claim 1 b. an electrically conductive backing, said layer being supported on backing in electrically conductive relationship therewith.

11. A photoconductive material according to claim 10 in which said backing comprises a laminate of an electrically conductive layer and an insulating support, said layer of said photoconductive composition being in electrical contact with said electrically conductive layer.

12. A photoconductive material according to claim 10 in which said layer of photoconductive composition has a thickness of from 1 to 150 microns.

13. The material having a permanently conductive image pattern which results when the photoconductive material of claim 10 is exposed image-wise to light or other actinic radiation.

14. The visible image material which results upon developing a visible image from the permanently conductive image of the material of claim 13.

* * * * *